United States Patent
Liu et al.

(10) Patent No.: US 11,921,161 B2
(45) Date of Patent: Mar. 5, 2024

(54) SYSTEM FOR BROKEN-ROTOR BAR DETECTION IN INVERTER-FED INDUCTION MOTORS USING GRAPH-BASED MOTOR CURRENT SIGNATURE ANALYSIS

(71) Applicant: Mitsubishi Electric Research Laboratories, Inc., Cambridge, MA (US)

(72) Inventors: Dehong Liu, Lexington, MA (US); Zhe Zhang, Vernon, CT (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 17/474,763

(22) Filed: Sep. 14, 2021

(65) Prior Publication Data

US 2023/0080835 A1    Mar. 16, 2023

(51) Int. Cl.
*G01R 31/34* (2020.01)
*H02P 29/024* (2016.01)

(52) U.S. Cl.
CPC .......... *G01R 31/343* (2013.01); *H02P 29/024* (2013.01)

(58) Field of Classification Search
CPC .......................... G01R 31/343; H02P 29/024
See application file for complete search history.

(56) References Cited

U.S. PATENT DOCUMENTS

| 10,359,473 B2 * | 7/2019 | Qiao ....................... F03D 17/00 |
| 2011/0089882 A1 * | 4/2011 | Yeh ....................... G01R 31/343 |
| | | 180/65.285 |
| 2016/0266207 A1 * | 9/2016 | Liu ....................... G01R 31/50 |

OTHER PUBLICATIONS

Kun Tian, Tao Zhang, Yibo Ai and Weidong Zhang Induction Motors Dynamic Eccentricity Fault Diagnosis Based on the Combined Use of WPD and EMD-Simulation Study (Year: 2018).*
Rubi (978-1-5386-7713-1/19/$31.00, 2019 IEEE). (Year: 2019).*

* cited by examiner

*Primary Examiner* — Natalie Huls
*Assistant Examiner* — Sharad Timilsina
(74) *Attorney, Agent, or Firm* — Gene Vinokur

(57) ABSTRACT

A computer-implemented method is provided for detecting broken bar faults of an induction motor during operations. The method includes steps of acquiring, in a time domain, a signal of a stator current powering the induction motor with a fundamental frequency via an interface, wherein the induction motor is under a varying speed operation; converting the stator current to a complex space vector; transforming the complex vector to a transformed stator current by referencing to synchronous reference frame; performing Short time Fourier Transform (STFT) on the transformed stator current to get spectrogram matrix; removing a DC component from the spectrogram matrix; determining, in a frequency domain, sparse and smooth frequency components in the spectrogram matrix, wherein the determining includes a graph-based method by imposing a smoothness constraint and a sparsity constraint on the frequency component; and detecting a fault in the induction motor if the frequency component includes a continuously changing and sparse fault frequency component in the spectrogram matrix.

14 Claims, 5 Drawing Sheets

Fig. 4B — Non-continuous component indicates example stator current signal of healthy induction motor Fig. 4C — Example stator current frequency of healthy induction motor

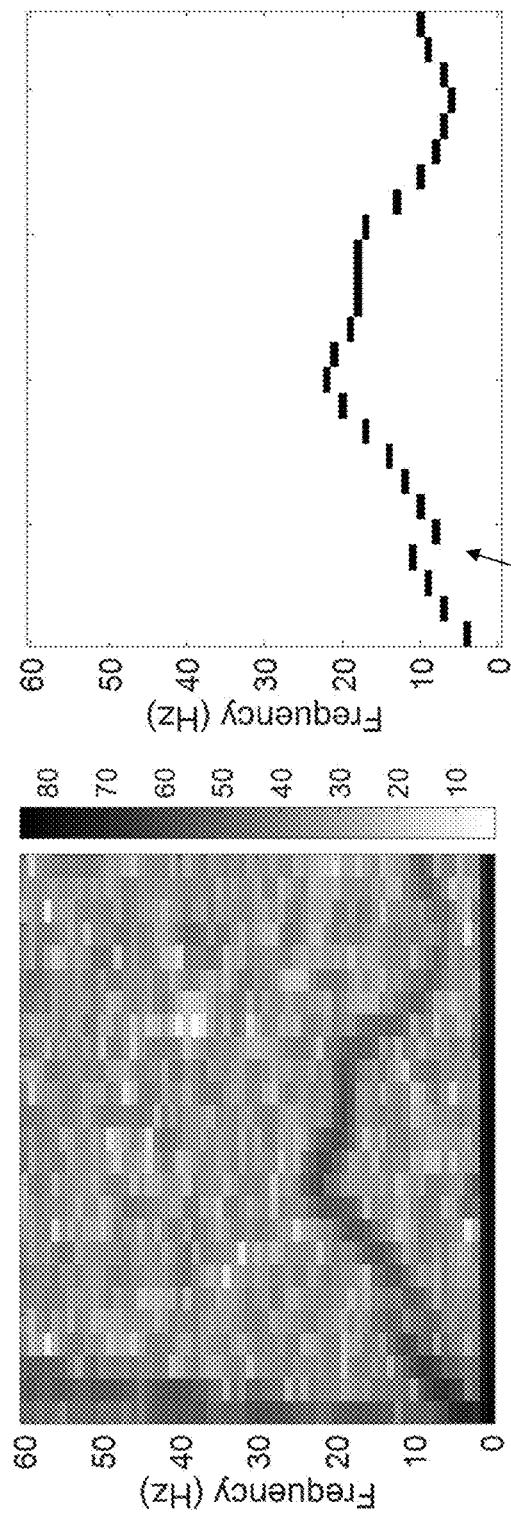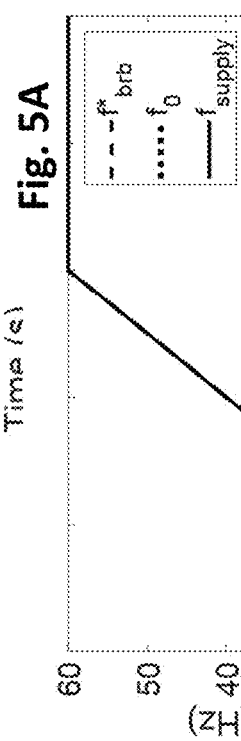
Fig. 5A
Fig. 5B
Continuous smooth and sparse component (curve) indicates fault signature
Fig. 5C
Example stator current signal of broken-bar fault induction motor

SYSTEM FOR BROKEN-ROTOR BAR DETECTION IN INVERTER-FED INDUCTION MOTORS USING GRAPH-BASED MOTOR CURRENT SIGNATURE ANALYSIS

FIELD OF THE INVENTION

The present invention relates, generally, to the field of monitoring electric machines, and, more particularly, to broken-bar fault detection in induction motors using graph-based stator current signature analysis.

BACKGROUND OF THE INVENTION

Three-phase induction motors (IMs) have been the major workforce in the industry due to their excellent performance, high robustness, and simplicity of construction. However, IMs are subjected to different types of faults, such as bearing fault, broken rotor bar fault, and eccentricity. Once a broken bar fault occurs, excessive vibration, poor starting performance, and torque fluctuation will be induced during operation. Even worse, it may cause catastrophic failure of the whole motor drive system. Therefore, it is of great importance to monitor machine condition and to detect motor faults in motor drive systems.

Different techniques for fault detection that are employed at present include, but are not limited to, vibration and acoustic noise analysis, electromagnetic field monitoring and axial flow measurement, temperature measurement, infrared recognition, and motor current signature analysis (MCSA) of stator current in the motor.

The cause-effect chain for rotor faults has been well investigated and demonstrated. In healthy conditions, the three-phase stator winding impedances are identical and induced rotor bar currents are well balanced. Frequency components at f and sf exist in the stator current and the rotor current, respectively, where f is the supply frequency and s is the slip. Once a rotor bar is broken, the corresponding circuit branch is open. A reverse rotating magnetic field is produced due to the loss of rotor circuit's symmetry and a negative frequency component at (−sf) appears in the rotor currents. Such negative frequency components produce the first fault frequency component at (1−2s)f in the stator current, causing a pulsating torque and a speed oscillation at the frequency of 2sf. Consequently, a set of new frequency components at frequencies of (1±2ks)f, where k=0, 1, 2, . . . , will appear in the spectrum of stator currents as well as a new set of frequency components at frequencies of ±(1+2 k)sf in rotor currents. In general, broken-bar fault diagnostic techniques are focused on detecting the fault dominant component at frequency of (1−2 s)f in the stator current.

Based on stator current frequency spectrum, MCSA methods aim to extract characteristic frequency components for different types of faults, such as bearing fault, broken bar fault, and eccentricity. Such a technique is receiving increased attention in the detection of mechanical faults in electric machines due to offering significant economic savings and simple implementation. However, the most common practice of MCSA in rotor fault detection is dealing with line-fed IMs under stationary conditions, or assuming the motor speed and the load are constant in the short measurement period, see, e.g. US20160266207A1. Since nowadays voltage source inverters (VSI) driven IMs are becoming popular in industrial environments for the sake of efficiency and carbon neutrality, where stationary operations are quite unusual, conventional MCSA methods are either no longer applicable or with poor detection performance.

For example, the magnitude of fault signatures can vary at different load and different speed condition, given that fault signatures in the stator current are already subtle. As a result, it can be difficult to extract fault signatures when the motor is driven by an inverter and rotor bars of the induction motor are faulty.

Therefore, there exists a need for a method and a system for detecting faults of in inverter-fed induction motors based on current signature analysis.

SUMMARY OF THE INVENTION

It is an object of some embodiments of an invention to provide a system and a method suitable for performing a broken bar fault detection of an induction motor based on analysis of the stator current powering the induction motor with varying speed and varying load operation of the induction motor. In such a manner, the broken bar fault detection can be performed continuously and concurrently with the operation of the induction motor, and without a need for restarting the induction motor.

It is another object of some embodiments to provide such a system and a method that can perform the broken-bar fault detection when the induction motor is fed by an inverter with a varying load and a varying speed.

Some embodiments of the invention are based on recognitions that under fault conditions the resulting stator current powering the induction motor is sparse in a frequency domain of a short time window. This is because the stator current includes a fundamental frequency of a power supply generating the stator current and fault frequency components caused by the fault. The spectral magnitudes of the fault frequency components are generally small. In addition, the fault frequency component with the highest magnitude has fault characteristic frequency that is close to the fundamental frequency, e.g., within 5% of the fundamental frequency.

Some embodiments of the invention are based on recognitions that the fault frequency component changes continuously from one short-time window to the next short-time window due to the change of operation speed.

Some embodiments of the invention are based on recognitions that the graph-based signal denoising techniques are used to denoise signal by exploring the relationship of neighborhood signals.

These recognitions lead to a realization that the combination of the sparsity of the frequency components, the smoothness of the frequency components across short-time windows, wherein the sparsity meaning only a few (one or two) none-zero frequency components in each short-time window, and the smoothness meaning the difference of frequency components of two consecutive time windows is small, and the relationship of neighborhood graph signals enable detection of the broken bar fault signature frequency components using graph-based signal processing techniques.

Accordingly, some embodiments of the present invention can provide a computer-implemented method for detecting broken bar faults of an induction motor during operations. The computer-implemented method may include: acquiring, in a time domain, a signal of a stator current powering the induction motor with a fundamental frequency via an interface, wherein the induction motor is under a varying speed operation; converting the stator current to a complex space vector; transforming the complex space vector to a transformed stator current by referencing to synchronous reference frame; performing Short time Fourier Transform (STFT) on the transformed stator current to get a spectrogram matrix; removing a DC component from the spectrogram matrix; determining, in a frequency domain, sparse and smooth frequency component in the spectrogram matrix, wherein the determining includes performing a graph-based method by imposing a smoothness constraint and a sparsity constraint on the frequency component; and detecting a fault in the induction motor if the frequency component includes a continuously changing sparse fault frequency component in the spectrogram matrix.

Further, according to some embodiments of the present invention, a fault detection system is provided for detecting broken bar faults of an induction motor during operations. The fault detection system may include: an interface configured to acquire signals via sensors, wherein one of the sensors is arranged to measure, in a time domain, signals of a stator current powering the induction motor with a fundamental frequency, wherein the induction motor is under a varying speed operation; a memory to store computer-executable programs including a computer-implemented method of claim 1 and a fault detection program; a processor configured to perform steps of: converting the stator current to a complex space vector; transforming the complex vector to a transformed stator current by referencing to synchronous reference frame; performing Short time Fourier Transform (STFT) on the transformed stator current to get spectrogram matrix; removing a DC component from the spectrogram matrix; determining, in a frequency domain, sparse and smooth frequency component in the spectrogram matrix, wherein the determining includes performing a graph-based method by imposing a smoothness constraint and a sparsity constraint on the frequency component; and detecting a fault in the induction motor if the frequency component includes a continuously changing frequency component and sparse fault frequency component-in the spectrogram matrix.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

FIGS. 4A, 4B, and 4C are exemplar plots of a spectrogram of a stator current powering an induction motor in a time and a frequency domain, denoised spectrogram using the graph-based method, and ideal operating current frequency, without the presence of the fault; and FIGS. 5A, 5B and 5C are exemplar plots of a spectrogram of a stator current powering an induction motor in a time and a frequency domain, denoised spectrogram (fault signature), and ideal operating current frequency and fault signal frequency, with the presence of the fault.

DETAILED DESCRIPTION OF THE PREFERRED EMBODIMENTS

Figure 1:
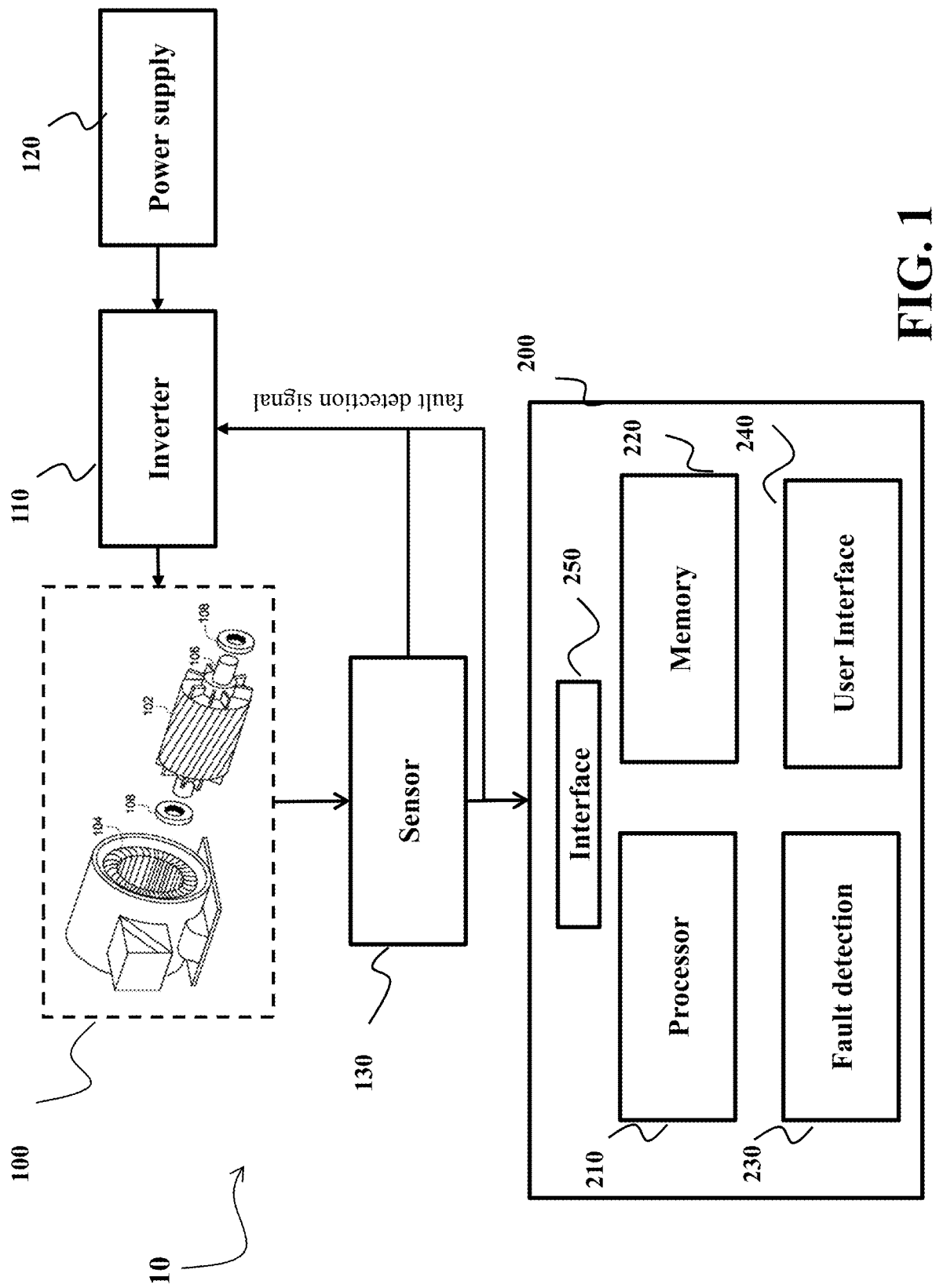
FIG. 1 is a schematic of a fault detection system for an inverter-fed induction motor according to embodiments of an invention.

Various embodiments of the present invention are described hereafter with reference to the figures. It would be noted that the figures are not drawn to scale elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

FIG. 1 is a schematic of a fault detection system configuration 10 illustrating an exemplar inverter-fed induction motor according to one embodiment of an invention. The induction motor 100 includes a rotor assembly 102, a stator assembly 104, a main shaft 106, and a main bearing 108. In this example, the induction motor 100 is a squirrel-cage induction motor. A broken rotor bar of the assembly 102 is a typical fault for such an induction motor.

The inverter 110 is powered by power supply 120 and can be used for monitoring and controlling the operation of the induction motor 100 in response to various inputs in accordance with embodiments of the present invention. For example, an inverter coupled with the induction motor 100 can control the speed of the induction motor based on inputs received from sensors 130 configured to acquire data pertaining to operating conditions of the induction motor 100. According to certain embodiments, the electrical signal sensors can be current and voltage sensors for acquiring current and voltage data pertaining to the induction motor 100. For example, the current sensor senses current data from one or more of the multiple phases of the induction motor. More specifically, in the case of the induction motor is a 3-phase induction motor, the current and voltage sensors sense the current and voltage data from the three phases of the 3-phase induction motor. While certain embodiments of the present invention will be described with respect to a multi-phase induction motors, other embodiments of the present invention can be applied to other multi-phase electromechanical machines.

Some embodiments of the present invention describe a system for detection of broken bar faults in an electric machine, such as the induction motor 100. The system configured for detection includes a fault-detection module 200 for detecting the presence of a faulty condition of various components, including rotor bars, within the induction motor assembly. In one embodiment, the fault detection module 200 is implemented as a sub-system of the inverter 110. In alternative embodiment, the fault-detection module 200 is implemented using a separate processor. The fault-detection module 200 may be a hardware circuit module that is operatively connected to the inverter 110. In some implementations the fault-detection module 200 and the inverter 110 can share the information. For example, the fault detection module 200 can reuse sensor data used by the inverter to control the operation of the induction motor.

Further, the fault-detection module 200 includes a processor 210, a memory 220, a fault detection program 230 stored in a storage to be uploaded to the memory 220 when the instructions of the program 230 are performed by the processor 210. The module 200 further includes an interface 250 configured to acquire signals from the sensors 130. The interface 250 includes A/D (analog/digital) and A/D (analog/digital) coverts to perform data communication with the processor 210 memory 220, the fault detection program 230, the user interface 240 and the sensor 130. The processor 210 may be multiple processors, and the memory 220 may be a memory module that includes multiple memories. The user interface 240 is configured to connect to a keyboard and a display unit configured indicate the normal/fault status information of the induction motor 100 in response to the output of the fault-detection module 200.

The presence of the broken bar in the induction motor 100 leads to reduction in the torque of the rotor thus leading to increasing reliance on other rotor bars of the induction motor 100 to provide the desired current. The increased dependence on other rotor bars leads to an increase in the rate of deterioration of the other rotor bars and thus leads to an overall effect on the performance of the induction motor.

In one embodiment of the invention, the current and voltage sensors respectively detect stator current data from the stator assembly 104 of the induction motor 100. The current data and voltage data acquired from the sensors is communicated to the inverter and/or the fault detection module for further processing and analysis. The analysis includes performing motor current signature analysis (MCSA) to detect faults within the induction motor 100 using a graph-based method. In some embodiments, upon detecting the fault by using the fault-detection module 200, the inverter 110 receives a fault detection signal via the interface 250 of the fault-detection module 200 stops the operation of the induction motor by transmitting an interrupting signal of the stator current of the induction motor 100 to the inverter 110 for further inspection or repair. In some cases, the sensors 130 may include a controller interface (not shown) that is configured to receive the fault detection signal from the interface 250 and transmit the fault state signal to the inverter 110 such that the invertor 110 interrupts the stator current of the induction motor 100 for stopping the operations of the induction motor 100. When the sensor 130 does not include the controller interface, the interface 250 may be configured to connect to the invertor 110 such that the invertor 110 interrupts the stator current of the induction motor 100 for stopping the operations of the induction motor 100 in response to the fault detection signal from the fault-detection module 200 via the interface 250.

The system also includes a memory for storing the measurements of the signal and various parameters and coefficients for performing a graph-based method (graph-based analysis). The system can also include a user interface for signaling the fault, if a continuously changing frequency component is detected in the spectrogram as the fault signature.

Figure 2:
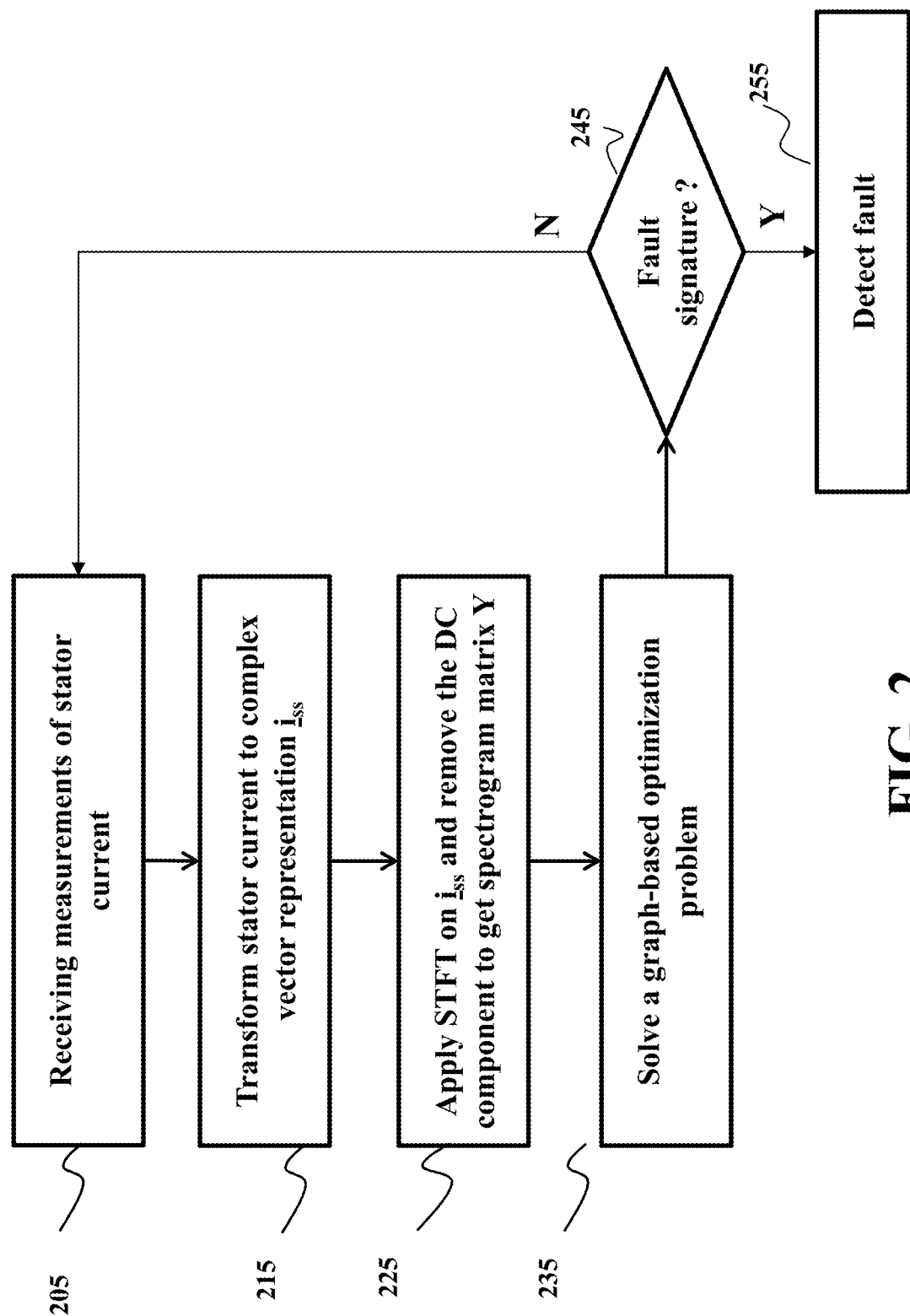
FIG. 2 is a block diagram of a system for detection of rotor bar faults in the induction motor according to embodiments of the invention.

FIG. 2 shows a block diagram of a method for detecting faults during a varying speed operation of an induction motor fed by inverter according to one embodiment of the invention. Three-phase time domain stator current is measured 205 by current sensor. The collected time domain current is then transformed to complex vector representation $i_{ss}$, referenced to a synchronous reference frame by applying the vector transformation 215. Apply STFT on $i_{ss}$ and remove the DC component to get spectrogram matrix Y 225. Based on the spectrogram matrix Y, we solve a graph-based optimization problem in which we impose sparsity and smoothness of the fault signature 235. If a fault signature (a smooth and sparse curve) is detected 245, the fault-detection module 200 determines that there is a broken bar fault 255. Otherwise, the module 200 keeps collecting stator current data for analysis.

Figure 3:
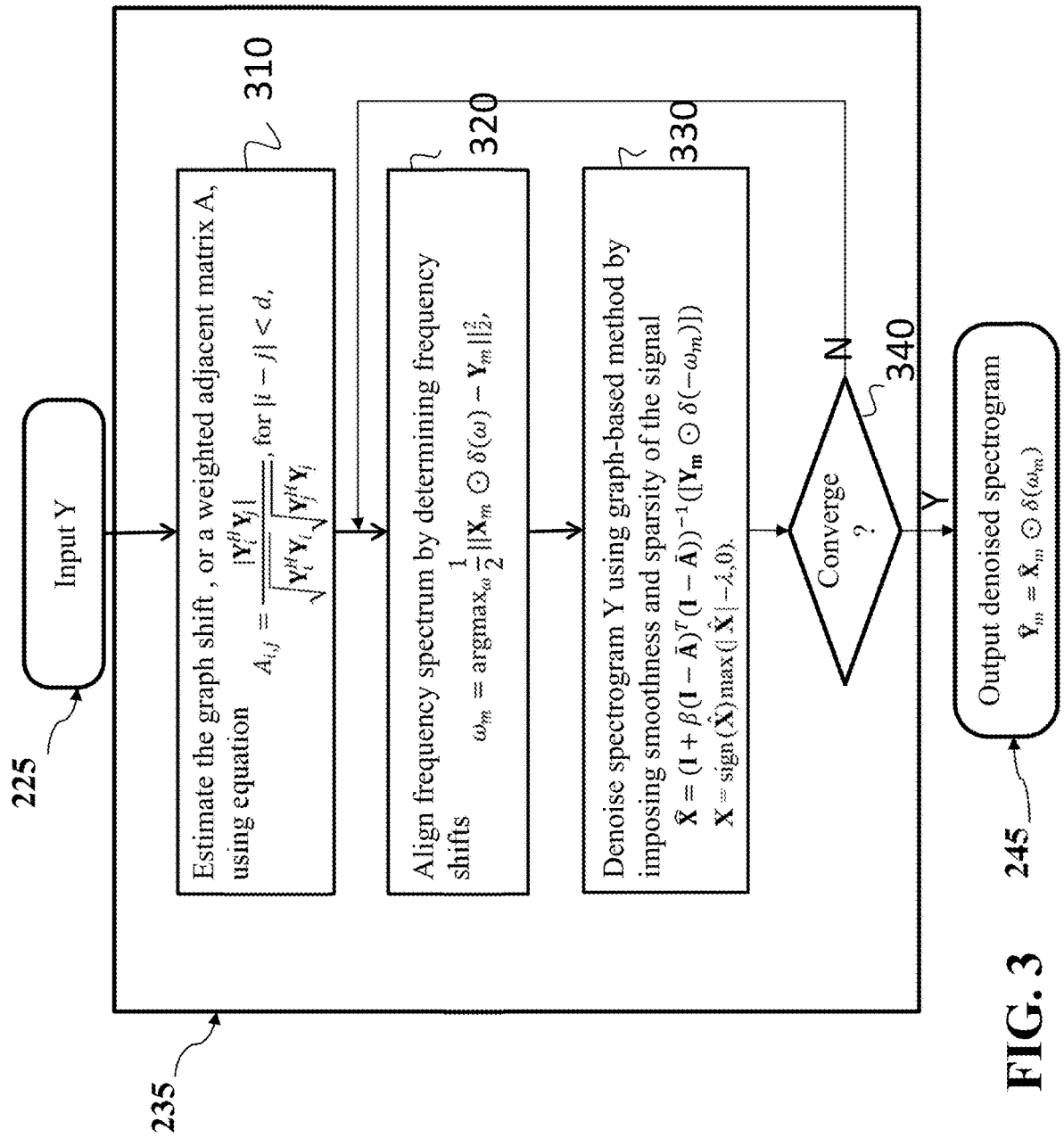
FIG. 3 is a block diagram of a graph-based method for detecting the faults in the induction motor according to embodiments of the invention.

FIG. 3 is a block diagram of a graph-based method for detecting the faults in the induction motor according to an embodiment of the invention. Given the spectrogram matrix Y 225, we first estimate the graph shift, or a weighted adjacent matrix A 310. Then we iteratively update the frequency shifts given well aligned spectrogram X, and the aligned spectrogram by imposing sparsity and smoothness of X given the frequency shifts, until a convergence criterion is met. The final smooth and sparse spectrogram 245 is used for fault signature detection.

Figure 4A:
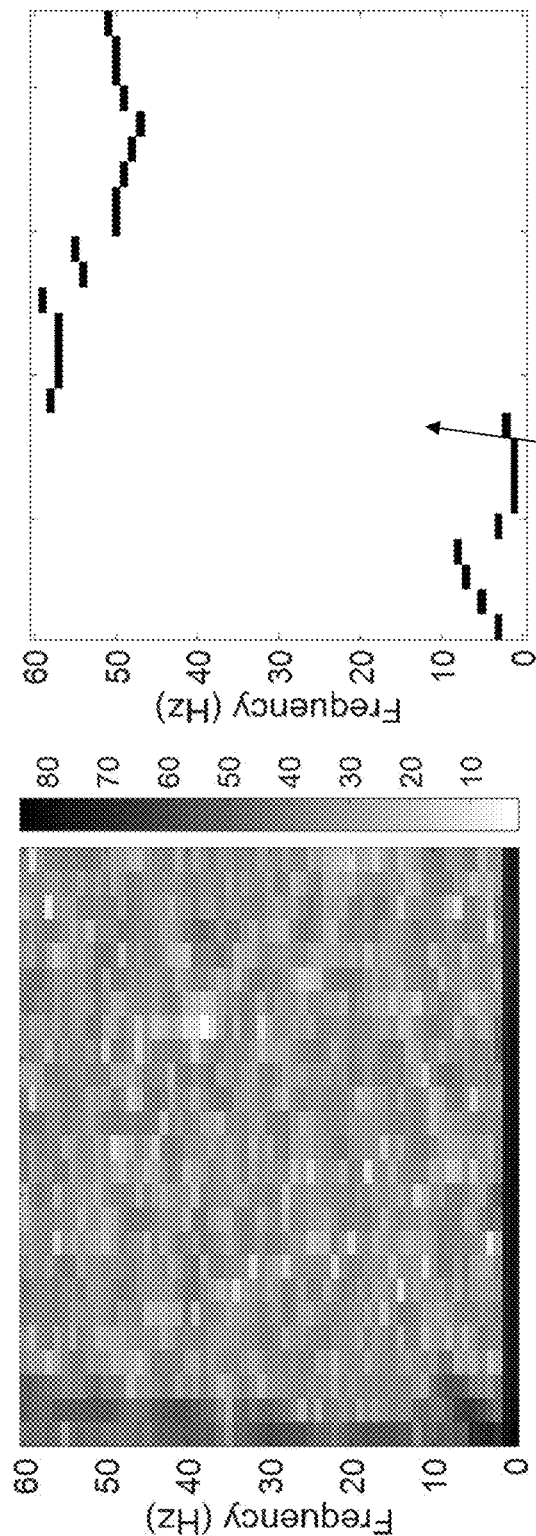
Figure 4A:
Figure 4A:
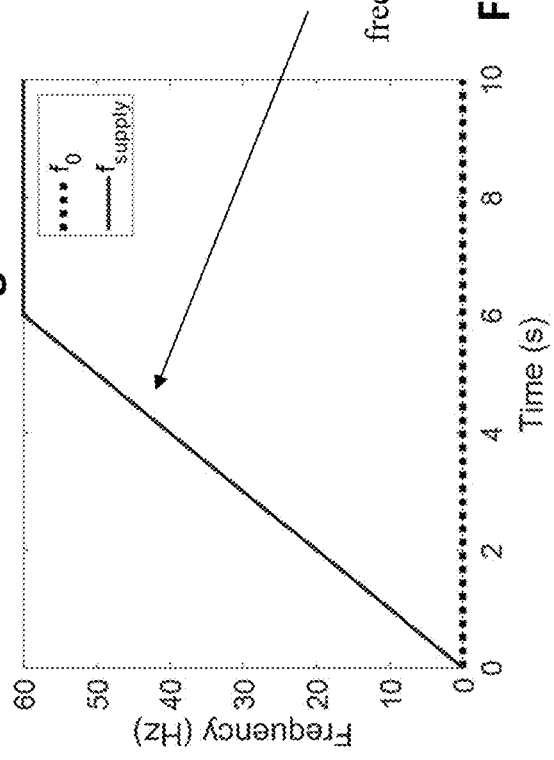

FIGS. 4A, 4B, and 4C are exemplar plots of a spectrogram of a stator current powering an induction motor in a time and a frequency domain, denoised spectrogram using the graph-based method, and ideal operating current frequency, without the presence of the fault.

FIG. 4A shows an exemplar spectrogram plot in the time-frequency domain of a motor current powering the induction motor. FIG. 4B shows the plot of denoised spectrogram in the time frequency domain without the presence of the fault. FIG. 4C shows the plot of operating frequency in the frequency domain and its transformed representation in the complex vector space.

FIGS. 5A, 5B, and 5C are exemplar plots of a spectrogram of a stator current powering an induction motor in a time and a frequency domain, denoised spectrogram, and ideal operating current frequency and fault signal frequency, with the presence of the fault.

FIG. 5A shows an exemplar spectrogram plot in the time-frequency domain of a motor current powering the induction motor. FIG. 5B shows the plot of denoised spectrogram in the time frequency domain with the presence of the fault. FIG. 5C shows the plot of operating frequency in the frequency domain, its transformed representation in the complex vector space, and the transformed fault signature frequency in the complex vector space.

When there exists a fault in the induction motor, the rotor operates asymmetrically, inducing a fundamental frequency component and extra fault frequency components $(1\pm 2ks)f_s$ in the stator current, where s is the speed slip; $f_s$ is the fundamental frequency of the power supply, and k=1, 2, 3 . . . is the harmonic frequency index. Since the operating frequency is varying, the dominant fault frequency $f_{sb}=(1-2s)f_s$ also varies.

We consider a three-phase squirrel-cage induction motor with n rotor bars (phases) on the rotor side. For any three-phase variable $\{x_a, x_b, x_c\}$, which can be voltage, current, or flux, etc., we define a corresponding complex state variable $\underline{X}_S$ on the stator side as $$X_s = \frac{2}{3}\begin{bmatrix} 1 & a & a^2 \end{bmatrix}\begin{bmatrix} x_a \\ x_b \\ x_c \end{bmatrix} = \frac{2}{3}(x_a + ax_b + a^2 x_c), \quad (1)$$

where $a = e^{j(2\pi/3)}$.

Similarly, for any rotor variable $\{y_1, y_2, \ldots, y_n\}$, we define a corresponding complex state variable $\underline{Y}_r$ on the rotor side as $$\underline{X}_r = \frac{2}{n}\begin{bmatrix} 1 & b & \ldots & b^{n-1} \end{bmatrix}\begin{bmatrix} y_1 \\ y_2 \\ \vdots \\ y_n \end{bmatrix} = \frac{2}{n}(y_1 + by_2 + \ldots + b^{n-1}y_n), \quad (2)$$

where $b = e^{j(2\pi/n)}$.

The phase current of a healthy induction machine contains the fundamental component and its harmonics in inverter-fed applications. When a rotor bar is broken, an additional dominant frequency of $(1-2)sf$ is produced in the stator current. Therefore, the equations of stator currents for a faulty induction machine can be written as $$i_a(t)=I_1 \cos(\omega_s t)+I_{brb} \cos(\omega_{brb} t+\phi_{brb}), \quad (3)$$

$$i_b(t)=I_1 \cos(\omega_s t-2\pi/3)+I_{brb} \cos(\omega_{brb} t+\phi_{brb}-2\pi/3) \quad (4)$$

$$i_c(t)=I_1 \cos(\omega_s t-2\pi/3)+I_{brb} \cos(\omega_{brb} t+\phi_{brb}+2\pi/3) \quad (5)$$

where $I_1$ corresponds to the amplitude of the fundamental component, $I_{brb}$ is the amplitude of the fault component, $\omega_s$ is the supply angular frequency in rad/s, $\omega_{brb}=(1-2s)\omega_s$ is the angular frequency of fault component, and $\phi_{brb}$ is the phase angle of fault component. In inverter-fed applications where the operation speed is variable, both $\omega_s$ and $\omega_{brb}$ are changing along with time.

According to complex space vector definition, the stator current in complex space vector representation is $$\underline{i}_s = \frac{2}{3}(i_a(t)+ai_b(t)+a^2 i_c(t))=I_1 e^{j\omega_s t}+I_{brb} e^{j(1-2s)\omega_s t}. \quad (6)$$

The complex space vector defined in (6) can be referenced to a synchronous reference frame by applying the vector transformation $$\underline{i}_{ss} = \underline{i}_s e^{-j\omega_s t} = I_1 + I_{brb} e^{-j(2s\omega_s)t}. \quad (7)$$

Note that the fundamental component appears to be DC quantity while a new fault signature at frequency of $2s\omega_s$ comes into play. As the DC component can be easily removed, the fault-related component is the oscillating term in $\underline{i}_{ss}$. We therefore define $I_{brb} e^{-j(2s\omega_s)t}$ as the signature of broken bar fault. It is clear that under variable speed operations, this fault signature is no longer a constant frequency component, but a time-varying frequency. Therefore, it is challenging for traditional motor current spectrum analysis (MCSA) methods to extract the fault signature as the fault signature spectrum energy spreads out in a relative wide frequency range. In order to extract this fault signature of time-varying frequency, some embodiments of the present invention provide a method to model the fault signature as a graph, with details introduced in the following subsection.

A Graph-Based Fault Signature Detection Method (Graph-Based Method)

An approach to processing a non-stationary signal is to represent it in the time-frequency domain using the short-time Fourier transform (STFT). The non-stationary signal is partitioned into short-time pieces using a sliding time window. Each windowed piece of signal is analyzed using the FFT, providing frequency spectrum information within the local time duration.

By performing STFT on the transformed stator current $\underline{i}_{ss}$, a matrix of signal spectrogram $Y=[Y_1, \ldots, Y_m, \ldots, Y_M]$ is obtained, in which column vector $Y_m$ represents the frequency spectrum of the $M^{th}$ windowed signal of the transformed stator current $\underline{i}_{ss}$. Each row of Y corresponds to a fixed frequency value. To avoid redundancy, we only consider frequency range $[0, F_S/2]$, where $F_S$ is the frequency sampling rate of stator current measurements. Since the operating speed and load is changing, the fault signature frequency is not a constant, meaning that the fault signature component in the spectrogram matrix does not lie in any single row vector. To effectively extract the fault signature component by use of the graph signal processing, we treat the ideal spectrogram of transformed stator current as a graph signal $G=(V, A)$, where $V=\{v_1, \ldots, v_m, \ldots, v_M\}$ is the set of nodes, represented by sequential moving time windows, and $A \in R^{M \times M}$ is the graph shift, or a weighted adjacency matrix that represents the pairwise proximity between nodes, frequency spectrum $Y_i \in C^k$ is then associated with the $i^{th}$ node of the graph. We can estimate the graph shift A through the STFT frequency spectra as $$A_{i,j} = \frac{|Y_i^H Y_j|}{\sqrt{Y_i^H Y_i} \sqrt{Y_j^H Y_j}}, \text{ for } |i-j|<d, \quad (8)$$

where the superscript H indicates the matrix Hermitian transpose, d is the maximal distance of connected neighborhood nodes in the graph. Therefore, the spectrogram matrix of the stator current at varying speed and varying load can then be treated as a noisy graph signal with an unknown frequency shift due to the varying operation, i.e., $$Y_m = X_m \odot \delta(\omega_m) + W, \text{ for } m=1, \ldots, M, \quad (9)$$

where $\odot$ stands for convolutional operation; $\delta$ is the Dirac delta function; and W is signal noise. $X=[X_1, \ldots, X_m, \ldots, X_M]$ represents the ideal spectrogram of constant frequency and constant load operation.

Based on graph-model based signal denoising, we extract the fault signature by solving an optimization problem (graph-based optimization problem) as $$\min_{X,\{\omega_m\}} \sum_{m=1}^{M} \frac{1}{2}\|X_m \odot \delta(\omega_m) - Y_m\|_2^2 + \lambda R_1(X) + \beta R_2(X) \quad (10)$$

where $\lambda$ and $\beta$ are hyper-parameters, $R_1(X)$ and $R_2(X)$ are regularizing terms. $R_1(X)$ is a sparsity constraint which imposes sparsity of the graph signal using $L_1$ norm as $$R_1(X) = |X|_1 = \sum_{i=1}^{N} |X_i|. \quad (11)$$

$R_2(X)$ is a smoothness constraint which promotes smoothness of graph signals, i.e., neighboring nodes should share a similar fault signature in the frequency domain. $R_2(X)$ can be expressed as $$R_2(X) = \frac{1}{2}\|X - \bar{A}X\|_F^2, \quad (12)$$

where $\bar{A}$ is a normalized graph shift matrix whose entries are computed as $$\bar{A}_{i,j} = \frac{A_{i,j}}{\Sigma_j A_{i,j}}$$

to ensure that the sum of each row of $\bar{A}$ equals to 1.

The goal is to recover X and $\omega_m$ from Y. The intuition behind the proposed graph-based denoising approach is that the rotor fault frequency components in two consecutive measurements have strong pairwise correlation and the fault signature is a sparse (non-zero) component in the frequency spectrum. Once the fault-detection module 200 obtains/detects a continuously changing and sparse frequency component forming a curve in the spectrogram (spectrogram matrix Y), the module 200 is configured to determine/recognize that the module 200 extracts/detects the fault signature.

The whole fault signature extraction problem can be summarized as the following stages.
1. Record the stator currents $i_a$, $i_b$, $i_c$ and transform them into the complex vector $i_{ss}$.
2. Apply STFT on $i_{ss}$ and remove the DC component to get the spectrogram matrix Y
3. Solve optimization problem (10):
   Estimate $\overline{A}$;
   Iteratively update $\omega_m$ and X until convergence.

$$b. \ \omega_m = \mathrm{argmax}_\omega \tfrac{1}{2} \|X_m \odot \delta(\omega) - Y_m\|_2^2, \qquad (13)$$

$$c. \ \hat{X} = (I + \beta(I - \overline{A})^T(I - \overline{A}))^{-1}([Y_m \odot \delta(-\omega_m)]), \qquad (14)$$

$$X = \mathrm{sign}(\hat{X}) \max(|\hat{X}| \lambda, 0). \qquad (15)$$

Further, according to some embodiments, the module 200 is configured to determine a type of the fault based on a frequency of the frequency component, wherein the type indicates bearing fault, broken bar fault, or eccentricity. For instance, the bearing fault frequency ranges from half the operation frequency to multiple times of the operating frequency, depending on the fault location in bearing. The broken bar fault frequency is typically close to the operation frequency, depending on the motor speed. For 60 Hz operation frequency, the broken-bar fault frequency in the complex space representation is less than the operation frequency. For instance, the broken-bar fault frequency can be typically below 20 Hz in transient operation and below 5 Hz in steady operation. Further, the eccentricity fault frequency can be observed typically about half of the operation frequency. Accordingly, for 60 Hz operation frequency, the eccentricity fault frequency in the complex space representation is around 30 Hz.

Yet further, some embodiments of the present invention can provide to detect the severity of the fault based on the magnitude of the frequency component.

The module 200 is configured to detect the fault, if there exists fault frequency component with magnitude greater than a certain value, for example, −30 dB of the fundamental frequency component. The greater the magnitude of the fault frequency, the more likely there is a, e.g., broken-bar fault. Accordingly, the module 20 is configured to interrupt supplying the stator current via the invertor 110 in response to detecting the fault.

The above-described embodiments of the present invention can be implemented in any of numerous ways. For example, the embodiments can be implemented using hardware, software or a combination thereof. When implemented in software, the software code can be executed on any suitable processor or collection of processors, whether provided in a single computer or distributed among multiple computers, for example, in a computer cloud. Such processors can be implemented as integrated circuits, with one or more processors in an integrated circuit component. Though, a processor can be implemented using circuitry in any suitable format.

Further, it should be appreciated that a computer can be embodied in any of a number of forms, such as a rack-mounted computer, a desktop computer, a laptop computer, minicomputer, or a tablet computer. Such computers can be interconnected by one or more networks in any suitable form, including as a local area network or a wide area network, such as an enterprise network or the Internet. Such networks can be based on any suitable technology and can operate according to any suitable protocol and can include, for example, wireless networks, wired networks or fiber optic networks.

Also, the embodiments of the invention can be embodied as a method, of which an example has been provided. The steps performed as part of the method can be ordered in any suitable way. Accordingly, embodiments can be constructed in which acts are performed in an order different than illustrated, which can include performing some acts simultaneously, even though shown as sequential acts in illustrative embodiments.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

The invention claimed is:

1. A computer-implemented method for detecting broken bar faults of an induction motor during operations, comprising:
   acquiring, in a time domain, a signal of a stator current powering the induction motor with a fundamental frequency via an interface from a current sensor connected to the induction motor, wherein the induction motor is under a varying speed operation;
   converting the stator current to a complex space vector;
   transforming the complex space vector to a transformed stator current by referencing to synchronous reference frame;
   performing Short time Fourier Transform (STFT) on the transformed stator current to get a spectrogram matrix;
   removing a DC component from the spectrogram matrix;
   determining, in a frequency domain, sparse and smooth frequency components in the spectrogram matrix, wherein the determining includes performing a graph-based method by imposing a smoothness constraint and a sparsity constraint on the frequency component;
   detecting a fault in the induction motor if the frequency component includes a continuously changing sparse fault frequency component in the spectrogram matrix;
   displaying a normal/fault status information of the induction motor on a display unit by transmitting a signal of the normal/fault status to a user interface connected to the display unit; and
   interrupting supplying the stator current in response to detecting the fault.

2. The method of claim 1, further comprising:
   determining a type of the fault based on a frequency of the frequency component, wherein the type indicates bearing fault, broken bar fault, or eccentricity.

3. The method of claim 1, further comprising:
   determining a severity of the fault based on an magnitude of the frequency component.

4. The method of claim 2, further comprising:
   rendering the type of the fault on a user interface.

5. The method of claim 1, wherein the measuring includes sampling the signal with a sampling rate of at least twice of the fundamental frequency of the signal.

6. The method of claim 1, wherein the induction motor is a three-phase squirrel-cage induction motor.

7. The method of claim 1, wherein the complex space vector includes three phase variables, wherein the three phase variables are a set of three phase voltages of a stator, a set of three phase currents of the stator current, or a set of fluxes of the stator with respect to the induction motor.

8. A fault detection system for detecting broken bar faults of an induction motor during operations, comprising:
- an interface configured to acquire signals via sensors connected to the induction motor, wherein one of the sensors is arranged to measure, in a time domain, signals of a stator current powering the induction motor with a fundamental frequency, wherein the induction motor is under a varying speed operation;
- a memory to store computer-executable programs including a computer-implemented method of claim 1 and a fault detection program;
- a processor configured to perform steps of:
- converting the stator current to a complex space vector;
- transforming the complex vector to a transformed stator current by referencing to synchronous reference frame;
- performing Short time Fourier Transform (STFT) on the transformed stator current to get spectrogram matrix;
- removing a DC component from the spectrogram matrix;
- determining, in a frequency domain, sparse and smooth frequency components in the spectrogram matrix, wherein the determining includes performing a graph-based method by imposing a smoothness constraint and a sparsity constraint on the frequency component; and
- detecting a fault in the induction motor if the frequency component includes a continuously changing frequency component and sparse fault frequency component-in the spectrogram matrix;
- displaying a normal/fault status information of the induction motor on a display unit by transmitting a signal of the normal/fault status to a user interface connected to the display unit; and
- interrupting supplying the stator current in response to detecting the fault.

9. The system of claim 8, further comprising:
determining a type of the fault based on a frequency of the frequency component, wherein the type indicates bearing fault, broken bar fault, or eccentricity.

10. The system of claim 9, further comprising:
determining a severity of the fault based on a magnitude of the frequency component.

11. The system of claim 9, further comprising:
rendering the type of the fault on a user interface.

12. The system of claim 8, wherein the measuring includes sampling the signal with a sampling rate of at least twice of the fundamental frequency of the signal.

13. The system of claim 8, wherein the induction motor is a three-phase squirrel-cage induction motor.

14. The system of claim 8, wherein the complex space vector includes three phase variables, wherein the three phase variables are a set of three phase voltages of a stator, a set of three phase currents of the stator current, or a set of fluxes of the stator with respect to the induction motor.

* * * * *